(12) United States Patent
Chon et al.

(10) Patent No.: US 6,590,378 B2
(45) Date of Patent: Jul. 8, 2003

(54) REAL TIME PARAMETER MONITORING APPARATUS FOR HIGH VOLTAGE CHAMBER IN SEMICONDUCTOR WAFER PROCESSING SYSTEM

(75) Inventors: Sang-Mun Chon, Sungnam-shi (KR); Gyeong-Su Keum, Suwon (KR); Hyung-Sik Hong, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/996,586

(22) Filed: Nov. 30, 2001

(65) Prior Publication Data

US 2002/0067177 A1 Jun. 6, 2002

(30) Foreign Application Priority Data

Dec. 4, 2000 (KR) .......................... 2000-73012

(51) Int. Cl.[7] .......................... G01R 31/00; G01R 1/02; G01R 11/32; G01N 21/00; A61N 5/00
(52) U.S. Cl. .......................... 324/96; 324/127; 324/142; 324/750; 324/501; 250/443.1; 250/492.1
(58) Field of Search .......................... 324/750, 501, 324/96, 127, 142; 250/443.1, 492.2; 348/340; 438/514

(56) References Cited

U.S. PATENT DOCUMENTS

| | | | | |
|---|---|---|---|---|
| 3,346,811 A | * | 10/1967 | Perry et al. | .................... 324/96 |
| 3,461,384 A | * | 8/1969 | Bayati et al. | .................. 324/96 |
| 3,488,586 A | * | 1/1970 | Watrous et al. | ................ 324/96 |
| 4,443,710 A | * | 4/1984 | Hofmann et al. | .............. 307/80 |
| 5,053,882 A | * | 10/1991 | Yanagidaira | ................. 358/342 |
| 5,347,535 A | * | 9/1994 | Karasawa et al. | ........... 370/342 |
| 5,544,523 A | * | 8/1996 | Uchiyama et al. | ......... 73/118.2 |
| 5,834,786 A | | 11/1998 | White et al. | |
| 5,883,393 A | | 3/1999 | Tien et al. | |
| 6,465,783 B1 | * | 6/2000 | Nakasuji | ..................... 250/311 |
| 6,084,240 A | | 7/2000 | Lin et al. | |
| 6,423,976 B1 | * | 7/2002 | Glavish et al. | ......... 250/492.21 |

* cited by examiner

*Primary Examiner*—N Le
*Assistant Examiner*—Wasseem H. Hamdan
(74) *Attorney, Agent, or Firm*—Volentine Francos, PLLC

(57) ABSTRACT

A parameter monitoring apparatus for a high voltage chamber in a semiconductor wafer processing system monitors parameters in the high voltage chamber in real time by converting an electrical signal generated from the high voltage chamber into an optical signal using an electro-optical converter. The optical signal is then converted back into an electrical signal again by an opto-electrical converter. The parameters can be monitored in real time without damaging measurement devices, since they are not influenced by the potential difference between the high voltage chamber and the measurement device.

15 Claims, 4 Drawing Sheets

REAL TIME PARAMETER MONITORING APPARATUS FOR HIGH VOLTAGE CHAMBER IN SEMICONDUCTOR WAFER PROCESSING SYSTEM

This application relies for priority upon Korean Patent Application No. 2000-73012, filed on Dec. 4, 2000, the contents of which are herein incorporated by reference in their entirety.

BACKGROUND OF THE INVENTION

1. Field of the Invention

The present invention relates to a semiconductor wafer processing system, and more particularly to a real time parameter monitoring apparatus for a high voltage chamber in the semiconductor wafer processing system.

2. Description of the Related Art

As the elements of a semiconductor device become smaller and more densely integrated, more precise wafer manufacturing techniques are required since the margin of error is greatly reduced, and even microscopic errors or defects can result in the production of inferior quality or poorly performing wafers.

In a conventional semiconductor wafer processing system, an ion implanter is widely used. Ion implanters use a high energy source to accelerate ionized dopant particles to a very high speed to thereby implant the accelerated dopant into a masked surface of a wafer. Ion implanters are widely used because they can correctly and easily control the quantity and distribution of impurities or dopants that are added. Examples of the ion implanters are disclosed in U.S. Pat. No. 5,834,786 by White et al., issued on November, 1998 and entitled "High Current Ribbon Beam Ion Implanter"; U.S. Pat. No. 5,883,393 by Tien et al., issued on November, 1999 and entitled "Source Inner Shield For Eaton NV-10 High Current Implanter"; and U.S. Pat. No. 6,084,240 by Lin et al., issued on January, 2000 and entitled "Ion Implanter".

FIG. 1 illustrates a general ion implanter 10. The ion implanter 10 comprises a high voltage chamber 11, a process chamber 16, and a load lock chamber 18. The high voltage chamber 11 includes a source chamber for producing ion beams, and a beam line chamber for controlling the strength of beams and accelerating them. The source chamber is insulated from the beam line chamber, and there is a large potential difference between the source chamber and the beam line chamber, on the order of about 40 kV. The beam line chamber is insulated from ground and has very high potential difference relative to ground, on the order of about 200 kV to ground.

In a semiconductor wafer process system using ion implantation techniques, the goal is to improve the efficiency and accuracy of the ion implantation, while maintaining the quality and uniformity of the ion implantation without increasing process costs.

To improve the efficiency and accuracy of the ion implantation, various INPUT parameters are measured, including wafer revolutions per minute (RPM), the voltage, the current, the pressure, and the temperature in the high voltage chamber, the amount of source gases, the mass of ion, the amount of ions, and the like. Preferably, these same parameters should be monitored in real time during the course of the ion implantation. This is because these parameters greatly affect the depth, accuracy and uniformity of the ion implantation process, which in turn greatly affects the characteristics of the semiconductor devices manufactured on the wafer.

However, in the past, the parameter values in the high voltage chamber could not be monitored in real time during the wafer manufacturing process. Instead, the parameter monitoring in the high voltage chamber was generally performed in the following manner. First the operation of the ion implanter was stopped. The high voltage chamber 11 was then opened to connect a plurality of measurement devices, such as the parameter measurement device 30 in FIG. 1, to parameter measurement sensors within the high voltage chamber 11. The parameter measurement device 30 was positioned at a safe distance from the high voltage chamber 11, and once the measurement devices were connected, the ion implanter was partially operated to measure the parameters through the parameter measurement device 30. Accordingly, an operator could ascertain certain values for the parameters in the high voltage chamber 11.

However, one significant drawback is that since the high voltage chamber 11 has a very high potential difference of 40 kV to 200 kV, an electrical arc could be generated, due to the potential difference between the high voltage chamber 11 and the parameter measurement device 30, when signals generated from the high voltage chamber are transmitted to the parameter measurement device 30. This electrical arc (as represented by the flash graphic in FIG. 1) sometimes severely damages the parameter measurement device 30.

Another drawback is that the ion implantation process must be stopped at regular intervals to take the measurements, which takes time and reduces throughput, which in turn increases per unit costs of production for the semiconductor devices.

SUMMARY OF THE INVENTION

In view of the foregoing, it is an object of the present invention to provide an improved parameter monitoring apparatus for a high voltage chamber in a semiconductor wafer processing system that can monitor parameters in the high voltage chamber in real time, thereby increasing the production rate of semiconductor wafers.

It is another object of the present invention to provide an improved parameter monitoring apparatus for a high voltage chamber in a semiconductor wafer processing system which can prevent parameter measurement devices from being damaged due to a potential difference between the high voltage chamber and the measurement devices during the parameter measurement.

To achieve these and other objects, the present invention provides a parameter monitoring apparatus for a high voltage chamber in a semiconductor wafer processing system, which includes an electrical-to-optical converter ("electro-optical converter") for converting an electrical signal generated from the high voltage chamber into an optical signal. The apparatus also includes an optical-to-electrical converter ("opto-electrical converter") for converting the optical signal from the electro-optical converter into an electrical signal. The apparatus also includes at least one measuring device for measuring the electrical signal converted by means of the opto-electrical converter.

Preferably, the electro-optical converter includes an input circuit for receiving the signal generated from the high voltage chamber, an amplifying circuit for amplifying a current and a voltage of the signal from the input circuit, a modulation signal generating circuit for generating a modulation signal for modulating the amplified signal, a modulating circuit for modulating the amplified signal in response to the modulation signal, and an output circuit for converting the modulated signal into an optical signal and outputting the optical signal.

Preferably, the opto-electrical converter includes an input circuit for receiving the optical signal from the electro-optical converter and converting it into an electrical signal, a demodulating circuit for demodulating the signal from the input circuit to extract a wave form of an original signal therefrom, an offset adjusting circuit for adjusting an offset voltage of the demodulated signal, and an output circuit for outputting the demodulated signal having the adjusted offset voltage.

BRIEF DESCRIPTION OF THE DRAWINGS

The foregoing and other objects, features and advantages of the invention will become more apparent from the following detailed description of a preferred embodiment thereof made with reference to the attached drawings, in which.

DETAILED DESCRIPTION OF PREFERRED EMBODIEMENTS

The present invention now will be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that this disclosure will be through and complete, and will fully covey the scope of the invention to those skilled in the art. Like numbers refer to like elements throughout.

In general, the parameter monitoring apparatus in accordance with the present invention monitors parameters in the high voltage chamber in real time by converting electrical signals generated from the high voltage chamber into optical signals by means of an electro-optical converter, and then converting the optical signals from the electro-optical converter back into electrical signals by means of an opto-electrical converter. Therefore, since the parameters in the high voltage chamber do not come under the influence of the potential difference caused by the high voltage (because they are in optical form), they can be monitored in real time without damaging the parameter measurement devices, and thus the production rate of semiconductor wafers can be increased.

Figure 1:
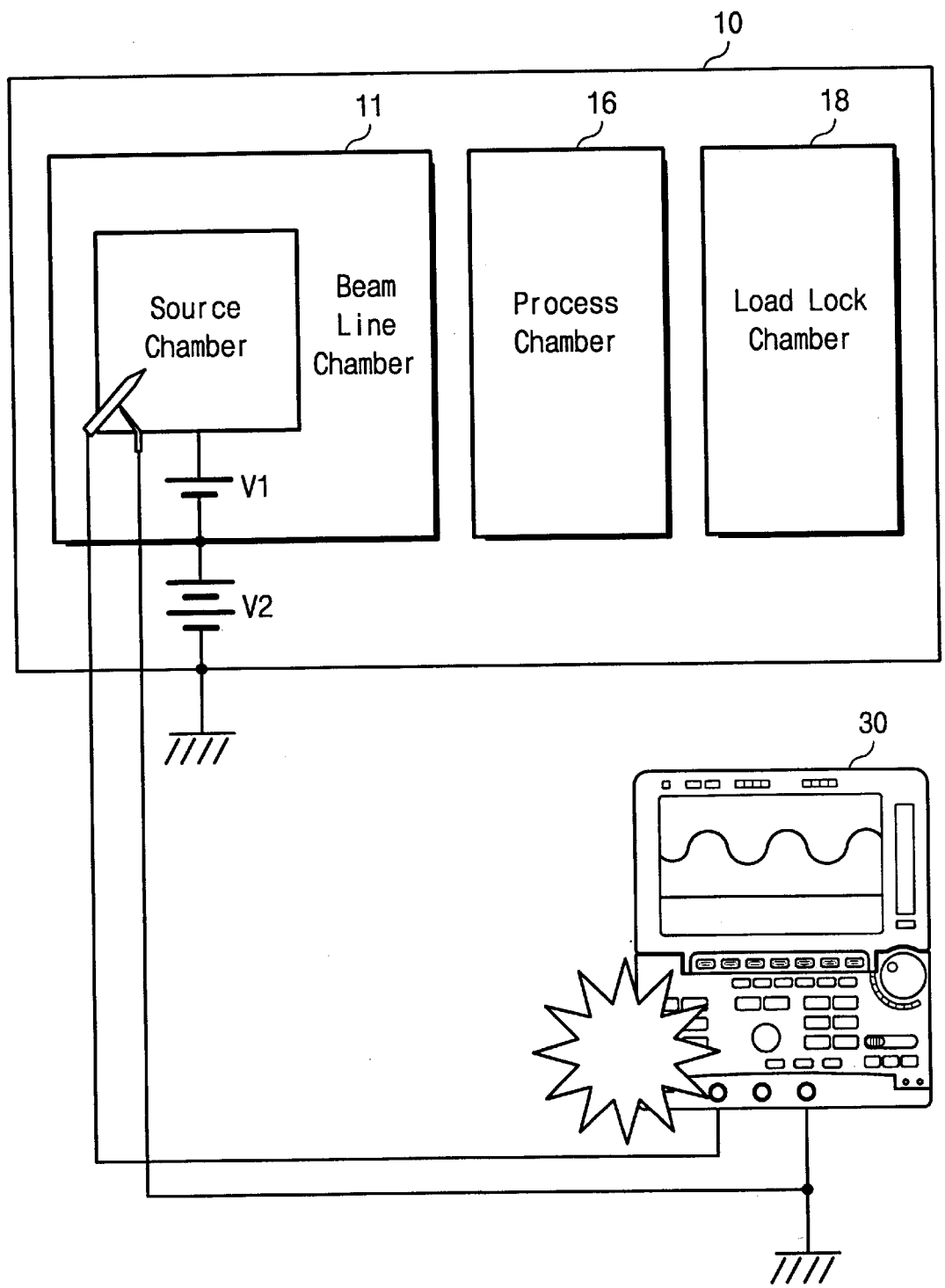
FIG. 1 is a block diagram of a conventional parameter monitoring apparatus for a high voltage chamber in a semiconductor wafer processing system.
Figure 2:
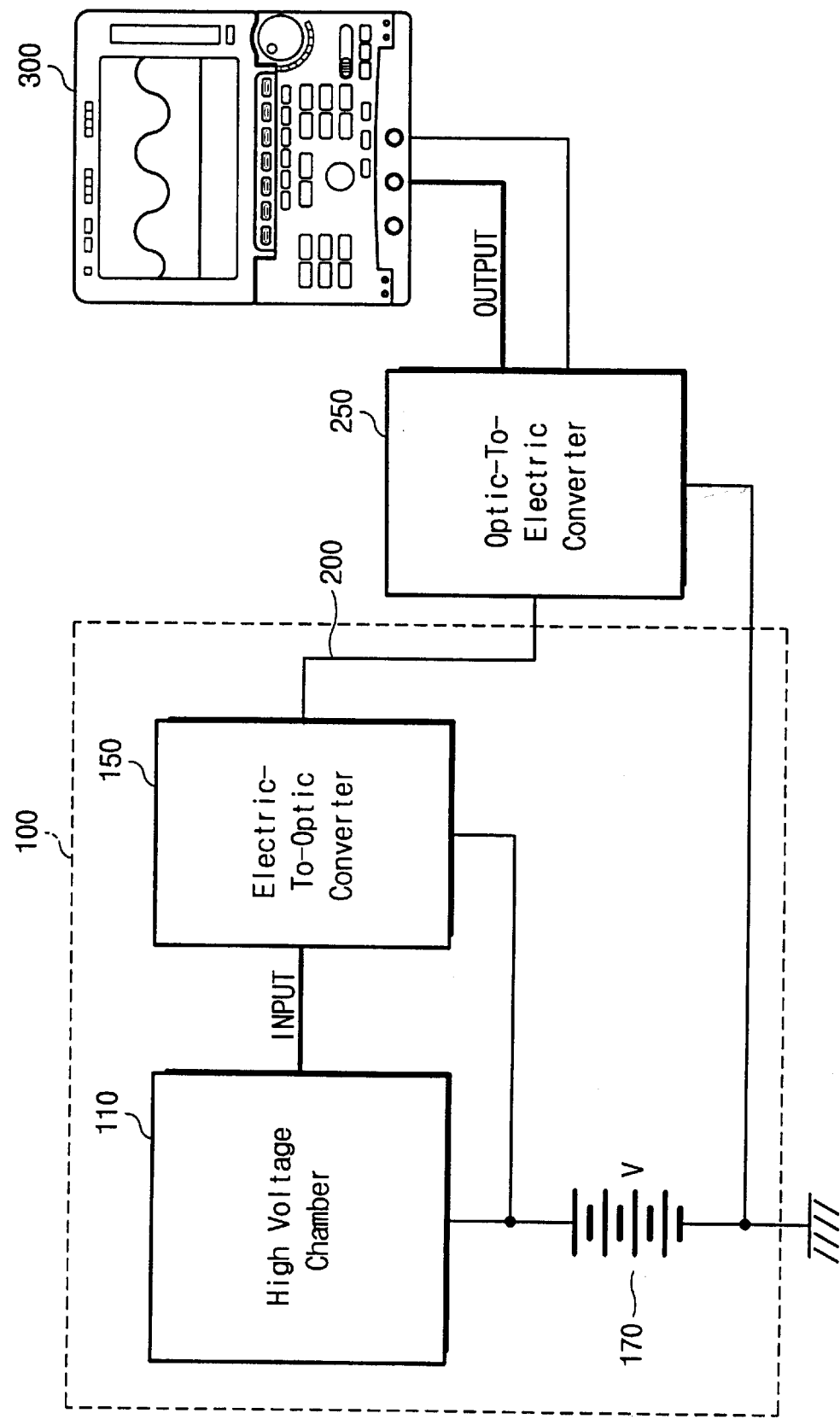
FIG. 2 is a block diagram of a parameter monitoring apparatus for a high voltage chamber in a semiconductor wafer processing system in accordance with a preferred embodiment of the present invention.

FIG. 2 is a block diagram of a parameter monitoring apparatus for a high voltage chamber in a semiconductor wafer processing system in accordance with a preferred embodiment of the present invention, which is employed in an ion implanter.

Referring to FIG. 2, an ion implanter 100 for use in a semiconductor wafer processing system comprises a high voltage chamber 110 for generating sufficiently high energy to excite ions and implant them into a wafer during the ion implantation process. An electro-optical converter 150 receives parameters (INPUT) as electrical signals, such as wafer revolutions per minute (RPM), the voltage, current, pressure, and temperature in the high voltage chamber 110, the amount of source gases, the mass of ion, or the amount of ions, and then converts them into optical signals. A high voltage power supply 170 connected to the high voltage chamber 110 supplies a high voltage V to the high voltage chamber 110, for example 5 kV to 650 kV, to be used in the ion implantation process.

When the parameter INPUT from the high voltage chamber 110 is inputted as an analog electrical signal into the electro-optical converter 150, the electro-optical converter 150 carries out a pulse width modulation process (PWM) on the parameter INPUT, and then converts the modulated signal into an optical signal to output it. The electro-optical converter 150 has an electrical-to-optical device disposed at an output end thereof, such as an optical or photo coupler, to accomplish the electrical-to-optical conversion. Accordingly, even though the high voltage power supply 170 supplies the high voltage V of 5 kV to 650 kV, the parameter INPUT in the high voltage chamber 110, i.e., the signal transmitted through the electro-optical converter 150, does not come under the influence of a potential difference due to the high voltage V since the signal is in optical form.

Outside of the ion implanter 100, an opto-electrical converter 250 is connected to the electro-optical converter 150 through an optical fiber line 200. After the electro-optical converter 150 modulates the parameter INPUT in the high voltage chamber 110 and then outputs in the form of an optical signal, the opto-electrical converter 250 receives the optical signal and then converts and demodulates it into the original signal form again (OUTPUT) before connecting to a parameter measurement device 300. The opto-electrical converter 250 has an optical-to-electrical device disposed at an input end thereof, such as an optical or photo coupler, to accomplish the optical-to-electrical conversion.

Thus, the converters 150, 250 of the present invention can modulate and demodulate the specific parameters in the high voltage chamber 110 without being negatively influenced by the high voltage V generated therein. Accordingly, the parameter monitoring apparatus of the present invention can monitor various parameters generated from the high voltage chamber 110 in real time without damaging the parameter measurement device 300. Accordingly, an operator can accurately control the high voltage chamber 110 to ensure that the ion implanter 100 is operated under proper conditions.

The converters 150, 250 for modulating and demodulating the parameters generated from the high voltage chamber 110 will now be described in detail with reference to FIG. 3 and FIG. 4.

Figure 3:
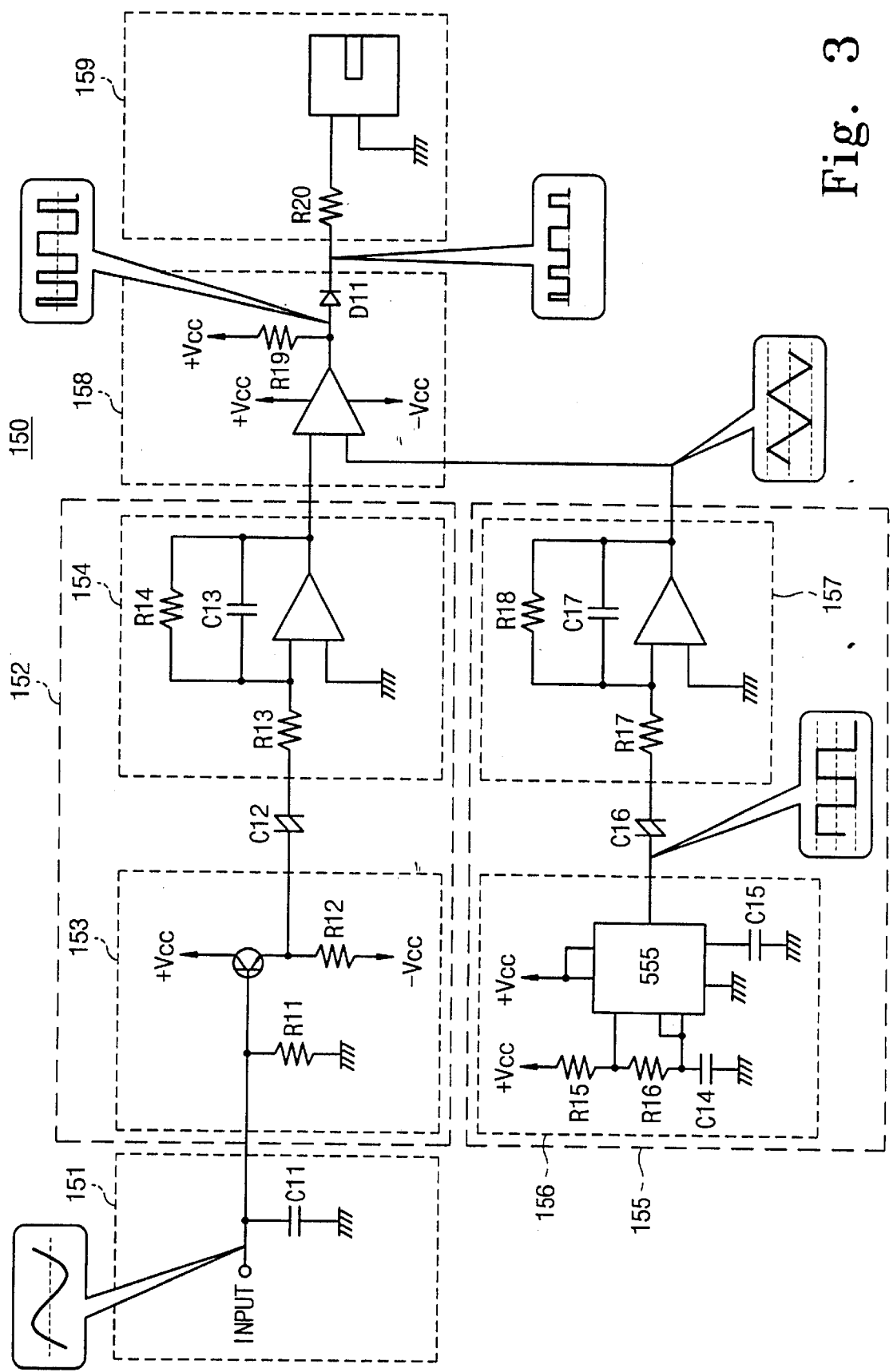
FIG. 3 is a circuit diagram illustrating an example of an electro-optical converter shown in FIG. 2.

FIG. 3 is a circuit diagram illustrating an example of the electro-optical converter 150 shown in FIG. 2. Referring to FIG. 3, the electro-optical converter 150 generally comprises an input circuit 151 for receiving a parameter INPUT (such as wafer revolutions per minute (RPM), the voltage, current, pressure, and temperature in the high voltage chamber 110, the amount of source gases, the mass of ion, or the amount of ions generated from the high voltage chamber 110) in the form of an analog signal.

An amplifying circuit 152 amplifies the voltage and current of the received signal. A modulation signal generating circuit 155 generates a modulation signal to be used in modulating the amplified signal. A modulating/negative signal removing circuit 158 performs two functions, namely, (i) modulates the amplified signal in response to the modulation signal generated from the modulation signal generating circuit 155, and (ii) removes a negative value associated with the modulated signal. An output circuit 159 converts the modulated signal having a positive value into an optical signal and then outputs the optical signal to the opto-electrical converter 250.

More specifically, the amplifying circuit 152 is composed of current and voltage amplifying circuits 153, 154, respectively, for amplifying the current and voltage of the signal outputted from the input circuit 151. The current amplifying circuit 153 includes a bipolar transistor to amplify the inputted current and output it. Alternatively, the bipolar transistor can be replaced by single polar transistors such MOS transistors according to the desired circuit design. Also, in the voltage amplifying circuit 154, a standard operational amplifier OP-AMP can be used, such as operation amplifier NE5532.

The modulation signal generating circuit 155 comprises a pulse generating circuit 156 for generating a rectangular shaped pulse signal, and a triangular pulse or saw tooth wave generating circuit 157 for converting the rectangular pulse wave generated from the pulse generating circuit 156 into a triangular pulse wave.

The modulation signal generating circuit 155 can be composed of a 555 model timer, for example, manufactured by Philips Semiconductors, with model names such as LM555, NE555, LM556, or NE556. The detailed specification of the 555 timer is disclosed in "555 Timer Data Sheet" pp. 1–7 issued by Philips Semiconductors on Aug. 31, 1994.

The triangular pulse generating circuit 157, for converting the rectangular pulse wave generated from the pulse generating circuit 156 into the triangular pulse wave, can be composed of a standard operational amplifier. Since the circuit construction of the triangular pulse generating circuit 157 is well known by those skilled in the art, a detailed explanation is omitted.

When the parameter INPUT in the high voltage chamber 110 is inputted into the modulating/negative voltage removing circuit 158 after being amplified by the amplifying circuit 152, the modulating/negative voltage removing circuit 158 carries out the PWM (pulse width modulation) in response to the modulation signal in the form of the triangular pulse wave generated from the modulation signal generating circuit 155. At this time, the modulation signal has a frequency of about 10 kHz. The signal amplified through the amplifying circuit 152 is modulated to have its pulse width widened or narrowed according to a slope of the modulation signal. For the modulating/negative voltage removing circuit 158, a device for modulating the signal can be formed of a dual differential comparator such as, for example, model KA393 manufactured by Fairchild Semiconductor Co. The detailed specification for this dual differential comparator is disclosed in "KA393/KA393A Data Sheet" pp. 1–10, issued by Fairchild Semiconductors Co. on Jul. 13, 2000.

After the PWM is completed, a portion having a positive value is extracted from the modulated signal by means of a diode D11 and then outputted into the output circuit 159. The output circuit 159 is composed of a device for optical transmission, such as a photo diode or laser diode, in a circuit called an optical coupler or photo coupler.

Figure 4:
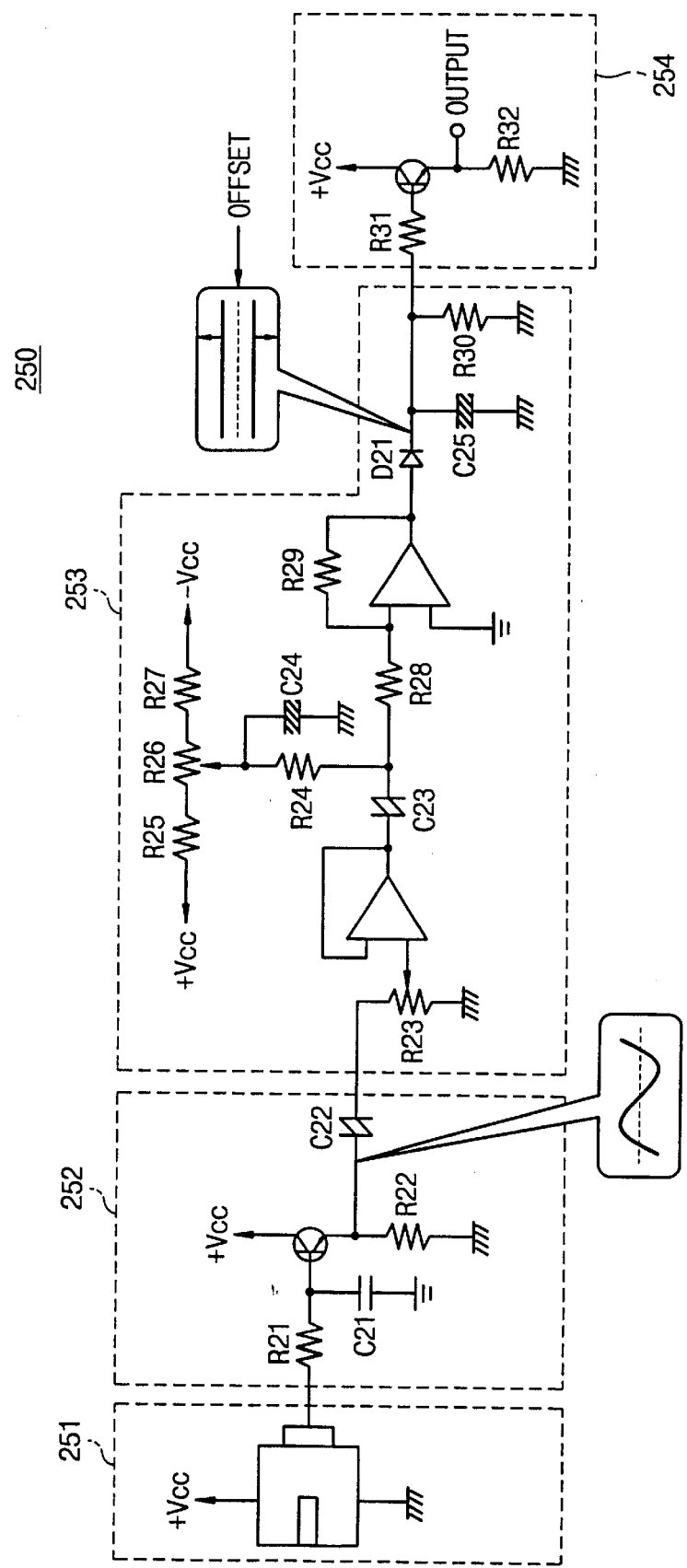
FIG. 4 is a circuit diagram illustrating an example of an opto-electrical converter shown in FIG. 2.

FIG. 4 is a circuit diagram showing an example of the opto-electrical converter 250 shown in FIG. 2. Referring to FIG. 4, the opto-electrical converter 250 comprises an input circuit 251 for receiving the optical signal transmitted through the electro-optical converter 150 and converting it into an electrical signal. Next, a demodulating circuit 252 demodulates the signal received through the input circuit 251 to extract a wave form of the original signal. An offset adjusting circuit 253 adjusts an offset voltage of the demodulated signal, and an output circuit 254 outputs an electrical signal having the adjusted offset voltage.

The input circuit 251 is composed of a device for optical receiving, such as a photo transistor in a circuit called an optical coupler or photo coupler. The input circuit 251 receives the optical signal from the electro-optical converter 150 in the ion implanter 100 and converts it into an electrical signal. The optical signal from the electro-optical converter 150 is transmitted and received through the optical fiber line 200, as shown in FIG. 2. Alternatively, the optical signal can be transmitted and received through a wireless optical transmitting and receiving apparatus.

After the optical signal is converted into an electrical signal via the input circuit 251, the demodulating circuit 252 demodulates the converted electrical signal. As described above, since the electro-optical converter 150 carried out the PWM for the purpose of transmitting the signal, it needs to demodulate the modulated signal to remove a carrier wave used in the modulation and extract the original signal. Since the parameter INPUT in the high voltage chamber 110 forming the original signal is a low frequency signal, and the carrier wave is a high frequency signal of about 10 kHz, the same wave form as the original signal INPUT can be obtained by making the modulated signal pass through a low-pass filter. Accordingly, the demodulating circuit 252 can be composed of a generally available low-pass filter.

When the same wave form as the original signal INPUT is obtained through the demodulating circuit 252, the offset adjusting circuit 253 adjusts an offset voltage to the obtained signal. At this time, the offset voltage can be adjusted within the range of −5 V to +5 V.

After the offset voltage is adjusted, the signal INPUT is amplified as much as a given gain and outputted through the output circuit 254. A signal OUTPUT outputted through the output circuit 254 is inputted into the measurement device 300 (see FIG. 2), and the measured results are displayed in real time. If the measured parameter in the high voltage chamber 110 deviates from a given range, the measurement device 300 generates an alarm and/or initiates a control sequence to ensure the ion implanter 100 stops the wafer loading movement. Accordingly, the operating conditions of the high voltage chamber 110 (e.g., wafer RPM, the voltage, current, pressure and temperature in the high voltage chamber, the amount of source gases, the mass of ion, the amount of ions and the like) can be controlled.

Thus, when the parameters in the high voltage chamber 110 are ascertained and measured through the converters 150, 250 of the present invention, they are not influenced by the potential difference due to the high voltage V. Therefore, the parameters in the high voltage chamber 110 can be monitored in real time without damaging the measurement device, and as such, the production rate of the semiconductor wafers can be increased.

In summary, the parameter monitoring apparatus of the present invention can monitor the parameters in the high voltage chamber of the semiconductor wafer processing system in real time, and further, can prevent the measurement device from being damaged due to the potential difference between the high voltage chamber and the measurement device.

In the drawings and specification, there has been disclosed a typical preferred embodiment of the invention and, although specific terms are employed, they are used in a generic and descriptive sense only and not for purpose of limitation, with the scope of the invention being set forth in the following claims.

What is claimed is:

1. A parameter monitoring apparatus for a high voltage chamber in a semiconductor wafer processing system, the parameter monitoring apparatus comprising:

an electro-optical converter connected to the high voltage chamber for converting an electrical signal generated from the high voltage chamber into an optical signal;

an opto-electrical converter for converting the optical signal from the electro-optical converter into an electrical signal; and a measuring device for measuring a parameter of the electrical signal converted by the opto-electrical converter.

2. The apparatus according to claim 1, wherein the electrical signal generated from the high voltage chamber is an electrical signal selected from the group consisting of wafer revolutions per minute, a high voltage chamber voltage, a high voltage chamber current, a high voltage chamber pressure, a high voltage chamber temperature, an amount of source gases, a mass of ion, and an amount of ions.

3. The apparatus according to claim 1, wherein the electro-optical and opto-electrical converters transmit and receive a data through an optical transmitting line.

4. The apparatus according to claim 1, wherein the electro-optical and opto-electrical converters transmit and receive a data through a wireless optical transmitting device.

5. The apparatus according to claim 1, wherein the electro-optical converter comprises:

an input circuit for receiving the electrical signal generated from the high voltage chamber;

an amplifying circuit for amplifying a current and a voltage of the signal from the input circuit;

a modulation signal generating circuit for generating a modulation signal for modulating the amplified signal;

a modulating circuit for modulating the amplified signal in response to the modulation signal; and an output circuit for converting the modulated signal into an optical signal and outputting the optical signal.

6. The apparatus according to claim 5, wherein the output circuit comprises an electro-optical converting means for converting the modulated signal into the optical signal.

7. The apparatus according to claim 6, wherein the electro-optical converting means is one of a photo diode and laser diode.

8. The apparatus according to claim 5, wherein the modulating circuit comprises means for performing a pulse width modulation process.

9. The apparatus according to claim 8, wherein the modulating circuit further comprises means for removing a negative value of the modulated signal.

10. The apparatus according to claim 9, wherein the means for removing the negative value is a diode.

11. The apparatus according to claim 10, wherein the opto-electrical converter comprises:

an input circuit for receiving the optical signal from the electro-optical converter and converting the optical signal into an electrical signal;

a demodulating circuit for demodulating the signal from the input circuit to extract a wave form of an original signal therefrom;

an offset adjusting circuit for adjusting an offset voltage of the demodulated signal; and an output circuit for outputting the demodulated signal having the adjusted offset voltage.

12. The apparatus according to claim 11, wherein the input circuit comprises means for converting the optical signal into the electrical signal.

13. The apparatus according to claim 12, wherein the means for converting the optical signal into the electrical signal is a photo transistor.

14. The apparatus according to claim 11, wherein the demodulating circuit is a low-pass filter for removing a carrier wave included in the input signal.

15. The apparatus according to claim 1, wherein the electro-optical converter is located within an ion implanter, and the opto-electrical converter is located outside of the ion implanter.

* * * * *